US007851921B2

(12) United States Patent
Nakasato et al.

(10) Patent No.: US 7,851,921 B2
(45) Date of Patent: Dec. 14, 2010

(54) DEVICE MOUNTING BOARD HAVING MULTIPLE CIRCUIT SUBSTRATES, AND SEMICONDUCTOR MODULE WITH THE DEVICE MOUNTING BOARD

(75) Inventors: Mayumi Nakasato, Ogaki (JP); Hideki Mizuhara, Ichinomiya (JP); Takaya Kusabe, Gunma (JP); Sadamichi Takakusaki, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 619 days.

(21) Appl. No.: 11/830,505

(22) Filed: Jul. 30, 2007

(65) Prior Publication Data

US 2008/0023841 A1 Jan. 31, 2008

(30) Foreign Application Priority Data

| Jul. 31, 2006 | (JP) | ............................ 2006-208456 |
| Aug. 2, 2006 | (JP) | ............................ 2006-210558 |
| Jul. 18, 2007 | (JP) | ............................ 2007-187360 |

(51) Int. Cl.
*H01L 23/48* (2006.01)

(52) U.S. Cl. ................ 257/773; 257/686; 257/E23.174

(58) Field of Classification Search ................ 257/686, 257/773, E27.117, E27.119, E51.001, E23.174; 174/252, 256, 261; 29/846

See application file for complete search history.

(56) References Cited

U.S. PATENT DOCUMENTS

| 5,046,238 | A | * | 9/1991 | Daigle et al. .................. 29/830 |
| 5,274,912 | A | * | 1/1994 | Olenick et al. ................ 29/830 |
| 5,517,751 | A | * | 5/1996 | Bross et al. ................... 29/830 |
| 7,229,293 | B2 | * | 6/2007 | Sakurai et al. ................ 439/74 |

FOREIGN PATENT DOCUMENTS

| JP | 2000-156550 | 6/2000 |
| JP | 2004-207265 | 7/2004 |

* cited by examiner

*Primary Examiner*—Roy K Potter
(74) *Attorney, Agent, or Firm*—Fish & Richardson P.C.

(57) ABSTRACT

To reduce connection defects between a circuit substrate provided on a core substrate and a circuit to be mounted thereon, thereby improving reliability as a multilayered device mounting substrate. The device mounting substrate includes: a first circuit substrate composed of a substrate, an insulating layer formed on this substrate, and a first conductive layer (including conductive parts) formed on this insulating layer; and a second circuit substrate mounted on the first circuit substrate, being composed of a base, a second conductive layer (including conductive parts) formed on the bottom of the base, and a third conductive layer (including conductive parts) formed on the top of the base. Here, the first and second circuit substrates are bonded by pressure so that the first and second conductive parts are laminated and embedded together into the insulating layer. The first and second conductive parts form connecting areas in the insulating layer, thereby connecting the first and second circuit substrates electrically.

9 Claims, 10 Drawing Sheets

DEVICE MOUNTING BOARD HAVING MULTIPLE CIRCUIT SUBSTRATES, AND SEMICONDUCTOR MODULE WITH THE DEVICE MOUNTING BOARD

CROSS-REFERENCE TO RELATED APPLICATIONS

This application is based upon and claims the benefit of priority from the prior Japanese Patent Application No. 2006-208456, filed Jul. 31, 2006, the prior Japanese Patent Application No. 2006-210558 filed Aug. 2, 2006 and the prior Japanese Patent Application No. 2007-187360 filed Jul. 18, 2007, the entire contents of which are incorporated herein by references.

BACKGROUND OF THE INVENTION

1. Field of the Invention

The present invention relates to a mounting board, a method for manufacturing the same, and a semiconductor module.

2. Description of the Related Art

The functionality and sophistication of portable electronics equipment such as cellular phones, personal digital assistants (PDAs), digital video cameras (DVCs), and digital still cameras (DSCs) has been advancing at increasingly high speed. Under the circumstances, miniaturization and weight savings have become essential in order for these products to continue to be accepted in the market. To achieve this, highly integrated system LSIs have been sought. In the meantime, enhanced usability and convenience have been desired of such electronics equipment, and functional and performance sophistication has been required of LSIs to be used for the equipment. Consequently, while LSI chips of higher integration have grown in the number of I/Os, the packages themselves have also required miniaturization strongly. For the sake of satisfying both the requirements, there has been a high demand to develop a semiconductor package suited to packaging semiconductor components on a board at high density. To meet such a demand for high density, circuit substrates for mounting LSI chips have recently been made finer and become multilayered. For example, a method has been proposed for manufacturing a multilayered circuit substrate in which a film circuit substrate (resin film) provided with fine wiring is pasted onto a core substrate (flexible circuit substrate) via an adhesion layer (adhesive layer). According to this method, it is possible to fabricate the film circuit substrate by using a different process suited to forming fine wiring, and to achieve a high yield by selecting and pasting conforming pieces individually.

FIG. 7 is a cross-sectional view schematically showing the structure of a conventional device mounting board. The conventional device mounting board (multilayered circuit substrate) comprises: a flexible circuit substrate 101 having a circuit pattern 103; a resin film 102 having a circuit pattern 104 formed on either one or both of its surfaces, along with projections 106 capable of electrical connection on one surface; and an adhesive layer 110 formed by curing a nonconductive adhesive paste between the flexible circuit substrate 101 and the resin film 102. The projections 106 are fixed by the adhesive layer 110, and establish electrical connection between the circuit pattern 103 on the flexible circuit substrate 101 and the circuit pattern 104 on the resin film 102.

In the conventional device mounting board described above, the adhesive layer 110 and the flexible circuit substrate 101 are made of different materials, however, and temperature changes can thus easily cause thermal stress at the interface between the two due to different coefficients of thermal expansion of their respective materials. Consequently, when the device mounting board is subjected to heat, exfoliation may occur at the joint areas between the adhesive layer 110 and the flexible circuit substrate 101. There has thus been the possibility of a drop in connection reliability between the circuit pattern 103 on the flexible circuit substrate 101 and the circuit pattern 104 on the resin film 102.

Moreover, when the resin film 102 and the flexible circuit substrate 101 are pasted together with the adhesive layer 110, the low flowability of the adhesive layer 110 causes the adhesive layer 110 to remain at the interface between the projections 106 on the resin film 102 and the circuit pattern 103 on the flexible circuit substrate 101. This can also lower the connection reliability between the circuit pattern 103 on the flexible circuit substrate 101 and the circuit pattern 104 on the resin film 102.

SUMMARY OF THE INVENTION

The present invention has been developed in view of the foregoing circumstances, and a general purpose thereof is to provide a multilayered mounting board having excellent connection reliability between its circuit substrate and a circuit to be mounted thereon, and a method of manufacturing the same.

One embodiment of the present invention is a mounting board adapted to mount a device. This mounting board comprises: a first circuit substrate having a first conductive part embedded in an insulating layer; and a second circuit substrate arranged on the insulating layer, the second circuit substrate having a second conductive part, wherein the second conductive part is electrically connected with the first conductive part while the second conductive part is embedded in the insulating layer.

According to this embodiment, the second conductive part is embedded together with the first conductive part into the insulating layer, and both are fixed by this insulating layer. This improves connection reliability (the connection reliability between the first conductive part and the second conductive part) against thermal stress acting on the mounting board.

In the foregoing configuration, the first conductive part and the second conductive part are preferably made of the same metal. According to this configuration, the first conductive part and the second conductive part have the same coefficient of thermal expansion. This can further improve the connection reliability of the mounting board against thermal stress.

The foregoing configuration may further comprise a metal substrate on which the first circuit substrate is mounted.

Another embodiment of the present invention is a method of manufacturing a device mounting board adapted to mount a device. The method of manufacturing a device mounting board adapted to mount a device comprises: a first step of forming a first conductive part on an insulating layer of a first circuit substrate; and a second step of preparing a second circuit substrate having a second conductive part, and applying a pressure to the second circuit substrate with the second conductive part being in contact with the first conductive part so that the second conductive part is pushed into the insulating layer together with the first conductive part, thereby fixing the second circuit substrate onto the first circuit substrate.

According to this embodiment, the circuit substrate in which the second conductive part is embedded in the insulating layer together with the first conductive part and both are fixed by this insulating layer is formed by pushing the second circuit substrate into the insulating layer of the first circuit substrate by pressure with the second conductive part being in contact with the first conductive part. This simplifies the steps of manufacturing the mounting board (the circuit substrate having the second circuit substrate fixed onto the first circuit substrate). Consequently, a mounting board having an improved connection reliability (connection reliability between the first conductive part and the second conductive part) against thermal stress can be manufactured at low cost. When fixing the second circuit substrate to the first circuit substrate, the second conductive part is embedded into the insulating layer together with the first conductive part. This makes it possible to connect the second conductive part and the first conductive part while preventing the insulating layer from causing a residual film at the connection interface between the second conductive part and the first conductive part. As a result, it is possible to manufacture a mounting board that has improved connection reliability (connection reliability between the first conductive part and the second conductive part) against thermal stress.

In the foregoing configuration, the second step preferably includes: bonding the first circuit substrate and the second circuit substrate together using pressure when the insulating layer is in a semi-cured state; and heating the insulating layer to cure it. This makes it possible to easily embed the second conductive part and the first conductive part into the insulating layer in a self-aligning fashion. The mounting board can thus be manufactured at an even lower cost.

In the foregoing configuration, the bonding under pressure preferably includes arranging the second conductive part so as to cover the first conductive part before pressure bonding. As a result, the pressure from the second conductive part acts on the entire first conductive part uniformly so that the second conductive part can drive the entire first conductive layer into the insulating layer uniformly. This makes it possible to form the connecting area between the second conductive part and the first conductive part with high reproducibility and stability. This can improve the production yield of the mounting board, so that the mounting board can be manufactured at low cost.

In the foregoing configuration, the first step preferably includes shaping the first conductive part into a trapezoidal cross section having a top tapered toward the outside of the first circuit substrate. When bonding under pressure, the size of the second conductive part at the connecting surface between the first conductive part and the second conductive part is preferably smaller than that of the first conductive part at the same connecting surface. This makes it easier for the insulating layer to flow from the sides to the top of the trapezoidal-shaped first conductive part during pressure bonding. As a result, it becomes possible to manufacture a mounting board in which void production is suppressed near the connecting area between the first conductive part and the second conductive part. The resulting improved connection reliability of the mounting board can increase the production yield of the mounting board and thus lower the manufacturing cost of the mounting board.

Yet another embodiment of the present invention is a semiconductor module. This semiconductor module comprises: a mounting board according to any one of the foregoing configurations; and a semiconductor device mounted on the mounting board.

The foregoing configuration may further comprise a third conductive part for a voltage higher than that applied to the second conductive part to be applied thereto, with the third conductive part being formed on the insulating layer of the first circuit substrate. The semiconductor device may be mounted on an area where the third conductive part is formed.

Yet another embodiment of the present invention is a mounting board adapted to mount a device. This mounting board comprises: a core substrate; a first wiring structure formed on one of the principle surfaces of the core substrate; and a second wiring structure formed on the other principle surface of the core substrate. In this instance, at least either one of the first wiring structure and the second wiring structure includes: a first circuit substrate having a first conductive part embedded in an insulating layer; and a second circuit substrate arranged on the insulating layer, the second circuit substrate having a second conductive part, wherein the second conductive part is electrically connected with the first conductive part when being embedded in the insulating layer.

In the foregoing configuration, the first conductive part and the second conductive part may be made of the same metal. The core substrate may also be made of metal. The core substrate may otherwise be made of an insulating layer.

Yet another embodiment of the present invention is a method of manufacturing a mounting board adapted to mount a device. The method for manufacturing the mounting board comprises: a first step of forming an insulating layer on a substrate; a second step of forming a first conductive part and a second conductive part adjoining this first conductive part on a surface of the insulating layer, and shaping the first conductive part and the second conductive part into a forward-tapered shape at least at their side tops; and a third step of pressing the first conductive part and the second conductive part into the insulating layer, wherein the third step includes creating gaps between the sides of the first and second conductive parts and the insulating layer.

In the foregoing configuration, the second step may include shaping each of the first conductive part and the second conductive part into a trapezoidal cross section. Moreover, the third step may include: pressing the first conductive part and the second conductive part into the insulating layer when the insulating layer is in a semi-cured state; and heating the insulating layer to cure it.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
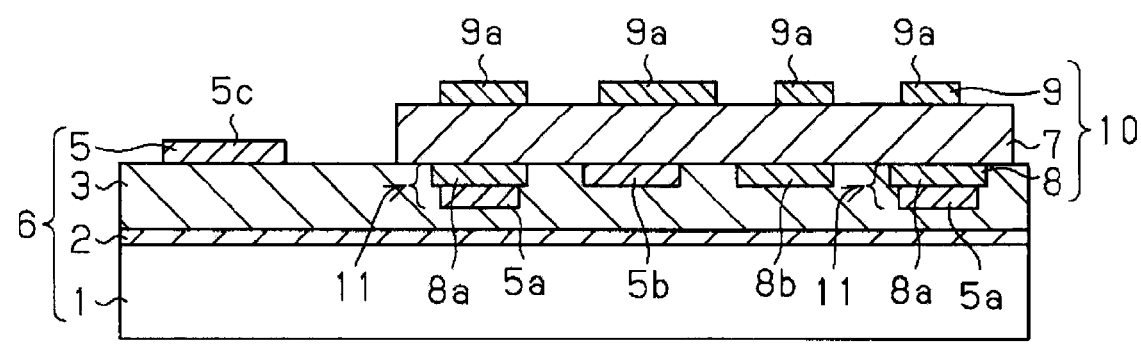
FIG. 1 is a schematic cross-sectional view of a mounting board adapted to mount a device according to a first example of a first embodiment of the present invention.

The invention will now be described by reference to the preferred embodiments. This does not intend to limit the scope of the present invention, but to exemplify the invention.

Hereinafter, embodiments of the present invention will described with reference to the drawings. It should be appreciated that in any of the drawings, identical components will be designated by like reference numerals, and a further description thereof will be omitted as appropriate.

First Embodiment

First Example

FIG. 1 is a schematic cross-sectional view showing the configuration of a mounting board adapted to mount a device according to a first example of the first embodiment of the present invention.

The mounting board according to the first example of the first embodiment comprises: a circuit substrate 6 which is composed of a substrate 1, a protective layer 2 formed on this substrate 1, an insulating layer 3 formed on this protective layer 2, and a conductive layer 5 (including conductive parts 5a to 5c) formed on this insulating layer 3; and a circuit substrate 10 which is mounted on the insulating layer 3 of this circuit substrate 6 and is composed of a base 7, a conductive layer 8 (including conductive parts 8a and 8b) formed on the bottom of this base 7, and a conductive layer 9 (including conductive parts 9a) formed on top of the base 7. In this instance, the circuit substrate 10 is bonded to the circuit substrate 6 by pressure so that the conductive layer 8 (including conductive parts 8a and 8b) of the circuit substrate 10 is embedded into and fixed by the insulating layer 3 of the circuit substrate 6. In particular, the conductive parts 8a are embedded into the insulating layer 3 so that they are in contact with and laminated with the conductive parts 5a. The conductive parts 8a and the conductive parts 5a form connecting areas 11 inside the insulating layer 3, thereby establishing electrical connection between the circuit substrate 10 and the circuit substrate 6.

Specifically, the substrate 1 is a metal plate made of copper (Cu), for example, and functions as a core substrate of the circuit substrate 6. This substrate 1 improves the heat radiation capability (thermal reliability) of the circuit substrate 6. It should be appreciated that the substrate 1 may be a resin substrate made of an epoxy insulating material, or a circuit substrate formed by laminating conductive layers and resin layers alternately.

The protective layer 2 is made of an insulating resin composed mainly of an epoxy resin, for example, and is formed on the substrate 1 to a thickness of approximately 10 μm. This protective layer 2 functions as a protective film for securing a withstand voltage between the conductive layer 5 and the substrate 1 when a high voltage is applied to the conductive layer 5 (conductive parts 5a in particular). It should be noted that when the substrate 1 is a resin substrate or circuit substrate, a humidity-proof protective film having the function of protecting the substrate 1 from moisture and the like is used as the protective layer 2.

The insulating layer 3 is made of a thermosetting resin composed mainly of an epoxy resin, for example, and is formed on the protective layer 2 to a thickness of approximately 150 μm. In view of improved heat radiation capability of the mounting board, the insulating layer 3 preferably has high heat conductivity. For this reason, the insulating layer 3 preferably contains highly heat-conductive fillers such as silver, bismuth, copper, aluminum, magnesium, tin, zinc, and alloys thereof, as well as silica, alumina, silicon nitride, and aluminum nitride.

The conductive layer 5 (including conductive parts 5a to 5c) is made of a metal such as copper or aluminum, and has a thickness of, for example, approximately 30 μm. The conductive parts 5a to 5c are each shaped to have a rectangular cross section. The conductive parts 5a and 5b form a wiring pattern, electrodes (including external electrodes), and the like which are arranged beneath the circuit substrate 10. Of these, the conductive parts 5a are embedded into the insulating layer 3 together with the conductive parts 8a of the circuit substrate 10 for lamination, thereby forming the connecting areas 11. The conductive part 5b is not connected with the conductive layer 8 of the circuit substrate 10 directly, but is instead embedded in the surface of the insulating layer 3. The conductive part 5c forms a wiring pattern, electrode (including any external electrode), or the like in an area other than where the circuit substrate 10 is formed. The conductive part 5c is not embedded into the insulating layer 3 of the circuit substrate 6, but is instead formed on the surface of the insulating layer 3.

The circuit substrate 6 is composed of the foregoing substrate 1, the protective layer 2 formed on this substrate 1, the insulating layer 3 formed on this protective layer 2, and the conductive layer 5 (including conductive parts 5a to 5c) formed on this insulating layer 3.

The base 7 is a resin substrate made of an epoxy insulating material, and functions as a core substrate of the circuit substrate 10. The base 7 may include a plurality of conductive layers, connection holes for connecting such, and others thereinside.

The conductive layer 8 (including conductive parts 8a and 8b) is made of a metal such as copper or aluminum, and has a thickness of, for example, approximately 30 μm. The conductive parts 8a and 8b are each shaped to have a rectangular cross section. The conductive layer 8 (including conductive parts 8a and 8b) forms a wiring pattern, electrodes (including external electrodes), and the like on the bottom side of the base 7. In this instance, the conductive parts 8a are formed so that their peripheries lie outside those of the conductive parts 5a of the circuit substrate 6, i.e., the conductive parts 8a have sizes (areas) greater than those of the conductive parts 5a. It should be noted that the sizes (areas) of the conductive parts 8a may be the same as those of the conductive parts 5a. When the circuit substrate 10 is bonded to the circuit substrate 6 by pressure, the conductive parts 8a thereof are embedded into the insulating layer 3 together with the conductive parts 5a of the circuit substrate 6 for lamination, thereby forming the respective connecting areas 11. In the meantime, the conductive part 8b is embedded into the surface of the insulating layer 3.

The conductive layer 9 (including conductive parts 9a) is formed with the same material, thickness, and shape as that of the conductive layer 8, for example. The conductive layer 9 forms a wiring pattern, electrodes (including external electrodes), and the like, and is arranged on the top surface of the base 7 opposing the conductive layer 8.

The circuit substrate 10 is composed of the foregoing base 7, the conductive layer 8 (including conductive parts 8a and 8b) formed on the bottom of this base 7, and the conductive layer 9 (including conductive parts 9a) formed on top of the base 7. The circuit substrate 10 is mounted on the insulating layer 3 of the foregoing wiring layer 6. The two boards are connected by embedding the conductive parts 8a of the circuit substrate 10 into the insulating layer 3 together with the conductive parts 5a of the circuit substrate 6 for lamination, thereby forming the respective connecting areas 11.

(Manufacturing Method)

FIGS. 2A to 2D are schematic cross-sectional views for explaining the process of manufacturing the mounting board according to the first example of the first embodiment of the present invention shown in FIG. 1.

Figure 2A:
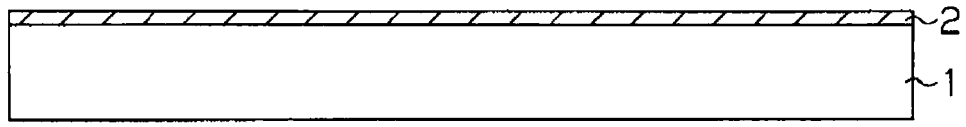
FIGS. 2A to 2D are schematic cross-sectional views for explaining the process of manufacturing the mounting board according to the first example of the first embodiment shown in FIG. 1.

Initially, as shown in FIG. 2A, a metal plate made of, for example, copper (Cu) is prepared as a substrate 1. Then, a protective layer 2 made of an insulating resin composed mainly of an epoxy resin is formed on this substrate 1 by roll coating. In this instance, the protective layer 2 shall have a thickness of approximately 10 μm, for example. This protective layer 2 functions as a protective film for securing a withstand voltage between the conductive layer 5 and the substrate 1 when a high voltage is applied to the conductive layer 5 (conductive parts 5a in particular). It should be appreciated that when the substrate 1 is a resin substrate or circuit substrate, a humidity-proof protective film having the function of protecting the substrate 1 from moisture and the like is used as the protective layer 2.

Figure 2B:
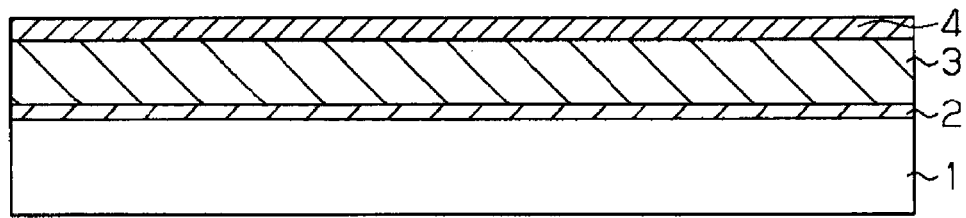

As shown in FIG. 2B, a laminate film made of an insulating layer 3 and copper foil (not shown) is bonded onto the protective layer 2 by thermocompression in a vacuum or at a reduced pressure. This process forms an insulating layer 3 made of a thermosetting resin composed mainly of an epoxy resin, having a thickness of approximately 150 μm, and copper foil (not shown) having a thickness of approximately 3 μm. Subsequently, the surface of the copper foil is plated with copper using electroless plating or electrolytic plating. As a result, a copper conductive layer 4 having a thickness of approximately 30 μm is formed on the insulating layer 3. At this step, the insulating layer 3 made of thermosetting resin is not fully cured by heat, but is instead kept in a semi cured state (flowable state).

Figure 2C:
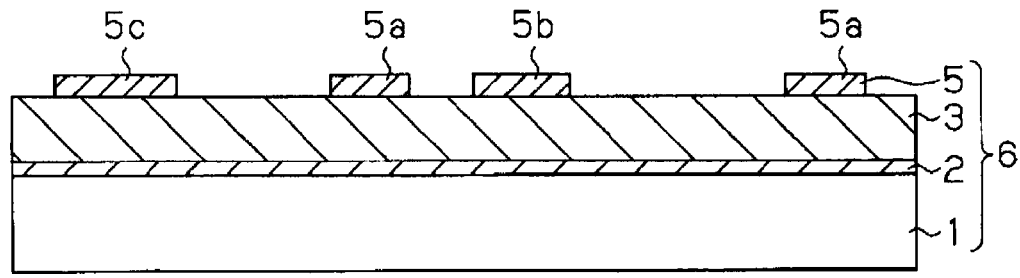

As shown in FIG. 2C, the conductive layer 4 is patterned into a conductive layer 5 having conductive parts 5a to 5c using photolithographic and etching techniques. In this instance, the etching condition is adjusted to shape the conductive parts 5a to 5c into rectangular cross sections. Consequently, rectangular conductive parts 5a to 5c for making part of a wiring pattern and electrodes are formed on the insulating layer 3. As a result, a circuit substrate 6 having the conductive layer 5 (including conductive parts 5a to 5c) on top of the insulating layer 3 of the substrate 1 is formed.

Figure 2D:
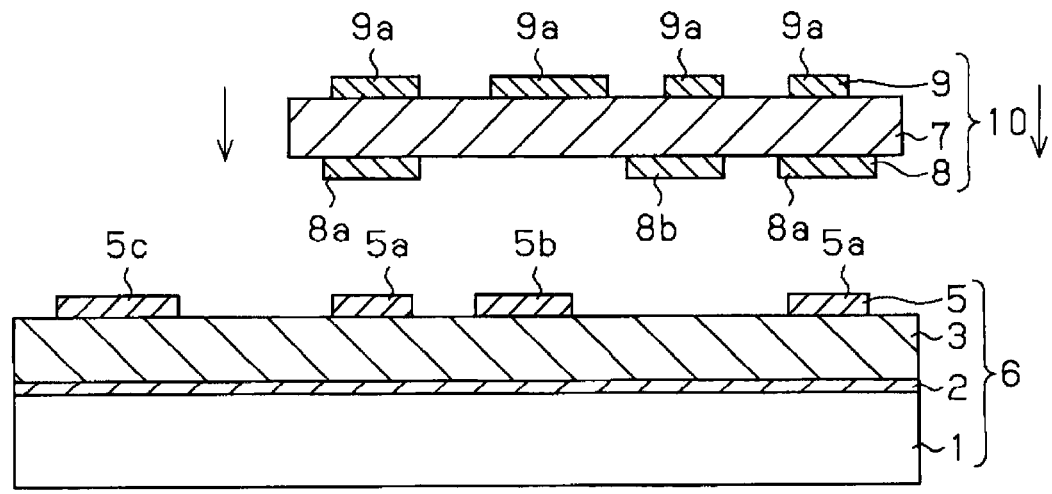

As shown in FIG. 2D, a circuit substrate 10 having a conductive layer 8 (including rectangular conductive parts 8a and 8b) and a conductive layer 9 (including rectangular conductive parts 9a) on the bottom and top of a base 7, respectively, is prepared. This circuit substrate 10 is arranged in a predetermined position on the top surface of the foregoing circuit substrate 6 (in particular, arranged so that the conductive parts 8a entirely cover the conductive parts 5a). These are sandwiched between flat plates (not shown) from above and below, and a uniform pressure (approximately 10 MPa) is applied to the circuit substrate 10, whereby the conductive layer 8 (including conductive parts 8a and 8b) of the circuit substrate 10 is pushed into the insulating layer 3 (pressure bonding step). Since the insulating layer 3 is in the semi-cured state (flowable state), the conductive layer 8 (including conductive parts 8a and 8b) is easily embedded into the insulating layer 3. It should be appreciated that the conductive parts 8a are arranged to cover the conductive parts 5a entirely, so that the pressure from the conductive parts 8a acts on the entire conductive parts 5a uniformly. The conductive parts 8a can thus drive the entire conductive parts 5a into the insulating layer 3 uniformly. As a result, the conductive parts 8a are embedded into the insulating layer 3 so that they are in contact with and laminated with the conductive parts 5a. As shown in FIG. 1, the conductive parts 8a and the conductive parts 5a form the connecting areas 11 in the respective corresponding positions, thereby establishing electrical connection between the circuit substrate 10 and the circuit substrate 6. The conductive part 5b formed on the insulating layer 3 is also pushed into the insulating layer 3 by the base 7 of the circuit substrate 10. Subsequently, heat treatment (150° C., 30 minutes) is applied to the insulating layer 3 so that the insulating layer 3 is cured completely (curing step).

Through the foregoing steps, the mounting board of the first example of the first embodiment is manufactured.

The mounting board and the method of manufacturing the same according to the first example of the first embodiment described above provide the following effects.

(1) The conductive parts 8a are embedded together with the conductive parts 5a into the insulating layer 3, and both are fixed by this insulating layer 3. This improves connection reliability (the connection reliability between the conductive parts 5a and the conductive parts 8a) against thermal stress acting on the mounting board.

(2) Since the conductive layer 5 (conductive parts 5a in particular) and the conductive layer 8 (conductive parts 8a in particular) are made of the same metal (copper), the conductive layers 5 and 8 have the same coefficient of thermal expansion. This can reduce thermal stress occurring between the two layers, with a further improvement to the connection reliability of the mounting board.

(3) The mounting board in which the conductive parts 8a are embedded together with the conductive parts 5a into the insulating layer 3, with both being fixed by this insulating layer 3, is formed by pushing the circuit substrate 10 into the insulating layer 3 of the circuit substrate 6 by pressure with the conductive parts 8a in contact with the conductive parts 5a. This simplifies the steps required for manufacturing this mounting board. Consequently, a mounting board having an improved connection reliability (connection reliability between the conductive parts 5a and the conductive parts 8a) against thermal stress can be manufactured at low cost.

(4) When bonding (fixing) the circuit substrate 10 to the circuit substrate 6 by pressure, the conductive parts 8a are brought into contact with the conductive parts 5a before being embedded into the insulating layer 3 for lamination. This makes it possible to connect the conductive parts 8a and the conductive parts 5a while preventing the insulating layer 3 from leaving a residual film at the connection interfaces between the conductive parts 8a and the conductive parts 5a. As a result, it is possible to manufacture a mounting board of improved connection reliability (connection reliability between the conductive parts 5a and the conductive parts 8a) against thermal stress.

(5) The circuit substrate 6 (including the conductive parts 5a) and the circuit substrate 10 (including the conductive parts 8a) are connected by the steps of: bonding them by pressure while the insulating layer 3 is in a semi-cured state; and heating the insulating layer 3 to cure it. As a result, the conductive parts 8a and the conductive parts 5a are both easily embedded into the insulating layer 3 in a self-aligning fashion. The mounting board can thus be manufactured at even lower cost.

(6) In the step of bonding under pressure, the conductive part 8a are arranged to cover the conductive parts 5a and then bonded (fixed) by pressure. The pressure from the conductive parts 8a therefore acts on the entire conductive parts 5a uniformly, and the conductive parts 8a can thus drive the entire conductive parts 5a into the insulating layer 3 uniformly. It is therefore possible to form the connecting areas 11 between the conductive parts 8a and the conductive parts 5a with high reproducibility and stability. This can improve the production yield of the mounting board, so that the mounting board can be manufactured at low cost.

(7) Since the circuit substrate 10 is made by a different fabrication process, it can be checked for defects before bonding. This can preclude defective circuit substrates 10 from entering the bonding step, thereby improving the production yield of the mounting board and allowing for low-cost manufacturing of the mounting board.

(8) The connecting areas 11 (including the conductive parts 8a and the conductive parts 5a) are fixed by the insulating layer 3 alone. This suppresses the occurrence of thermal stress which has conventionally occurred at interfaces when an adhesion layer (adhesive agent) is used (the thermal stress occurring from a difference between the coefficients of thermal expansion of the respective materials).

(9) When mounting the circuit substrate 10 on the circuit substrate 6, the two boards can be bonded without using a conventional adhesion layer (adhesive agent). This can reduce the manufacturing cost of the mounting board when compared to those available heretofore.

Second Example

If the conductive parts have rectangular cross sections like the conductive parts 5a in the first example of the first embodiment of the present invention, and the conductive parts 8a to be arranged thereon have small sizes, then voids can easily occur near the peripheries of the connecting areas 11 when laminating and embedding the conductive parts into the insulating layer 3. In order to preclude void production, pressure bonding requires a long pressing time at low pressure, which can possibly cause a drop in manufacturing throughput (and therefore an increase in manufacturing cost).

Figure 3:
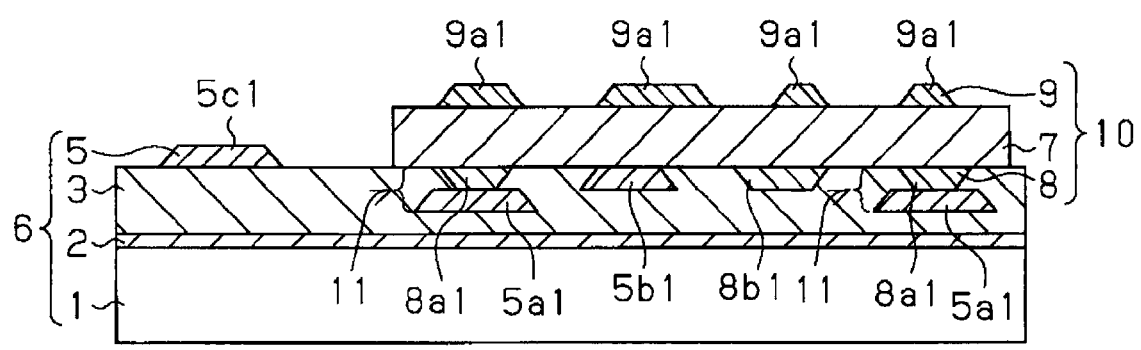
FIG. 3 is a schematic cross-sectional view of a mounting board adapted to mount a device according to a second example of the first embodiment of the present invention.

FIG. 3 is a schematic cross-sectional view showing the configuration of a device mounting board adapted to mount a device according to a second example of the first embodiment of the present invention. Differences from the first example of the first embodiment are as follows: (A) Conductive parts 5a1 to 5c1 formed on the circuit substrate 6 are shaped to have a trapezoidal cross section, being arranged with their tapered tops toward the outside of the board. (B) Conductive parts 8a1, 8b1, and 9a1 of the circuit substrate 10 are shaped to have a trapezoidal cross section, being arranged with their respective tapered tops facing toward the outside of the board. (C) In the connecting areas 11, the sizes of the conductive parts 8a1 (the sizes at the connecting surfaces in particular) are smaller than the sizes of the conductive parts 5a1 (the sizes at the connecting surfaces in particular). In all other respects, the mounting board is the same as that detailed in the first example of the first embodiment.

The connecting structure with such a trapezoidal configuration as detailed above is formed by preparing a circuit substrate 6 having trapezoidal-shaped conductive parts 5a1 to 5c1 and a circuit substrate 10 having trapezoidal-shaped conductive parts 8a1 and 8b1 (and conductive parts 9a1), and bonding the two by pressure, as shown in the step shown in FIG. 2D. It should be appreciated that the trapezoidal conductive parts 5a1 to 5a1 can be easily formed by adjusting the etching condition when shaping the conductive layer 5, as shown in the step shown in FIG. 2C of the foregoing first example of the first embodiment.

Aside from the effects of the first example of the first embodiment except the foregoing effect (6), the mounting board and the method for manufacturing the same according to this second example of the first embodiment provide the following effect.

(10) The conductive parts 5a1 are shaped into trapezoidal cross sections with their tops tapered toward the outside of the circuit substrate 6. Then, in the step of bonding under pressure, they are bonded to the conductive parts 8a1 such that the sizes of the conductive parts 8a1 at the connecting surfaces between the conductive parts 5a1 and 8a1 are smaller than those of the conductive parts 5a1 at the same connecting surfaces. This makes it easier for the insulating layer 3 to flow from the sides to the tops of the trapezoidal-shaped conductive parts 5a1. As a result, it is possible to manufacture a mounting board in which void production is suppressed near the connecting areas 11 between the conductive parts 5a1 and the conductive parts 8a1. The improved connection reliability of the mounting board can increase the production yield of the mounting board, and thus lower the manufacturing cost of the mounting board.

Third Example

Figure 4:
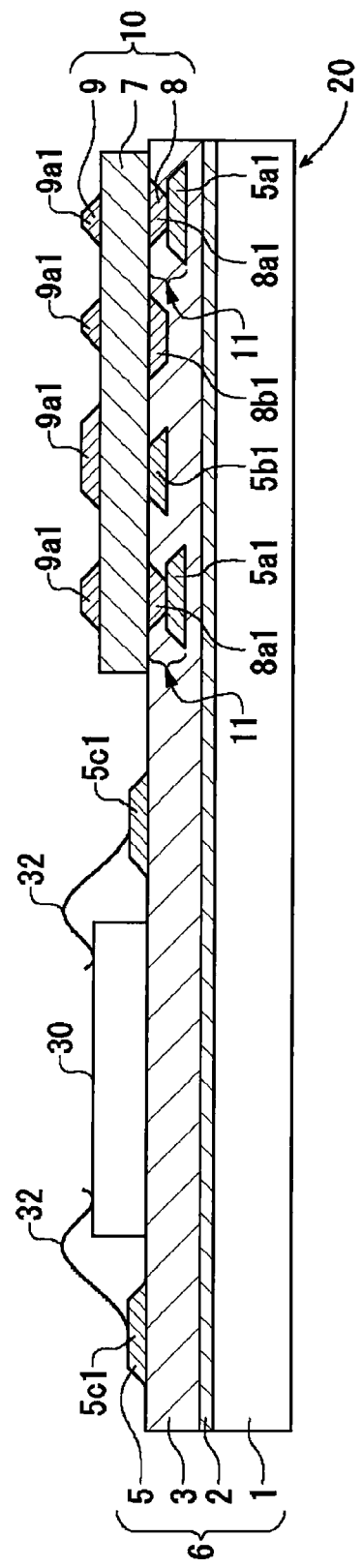
FIG. 4 is a schematic cross-sectional view showing the configuration of a semiconductor module according to a third example of the first embodiment of the present invention.

FIG. 4 is a schematic cross-sectional view showing the configuration of a semiconductor module according to a third example of the first embodiment of the present invention. This semiconductor module includes the mounting board 20 according to the second example of the first embodiment, and a semiconductor device 30 which is mounted on the mounting board 20. The semiconductor module of this example may be applied, for example, to an inverter module for driving the motor of a hybrid vehicle, or an inverter module intended for an automatic window motor of an automobile.

The conductive parts 8a1, 8b1, and 9a1 of the circuit substrate 10 are fed with low-voltage logic level signals (for example, 5V). Meanwhile, conductive parts 5c1 of the circuit substrate 6 are fed with signals of voltages higher than the logic level, i.e., high-voltage signals. The semiconductor device 30 is mounted on the area where the conductive parts 5c1 are formed. The semiconductor device 30 is a power device intended for an inverter module, and is wire-bonded to the conductive parts 5c1 with gold wires 32. As above, the semiconductor module of this example is configured so that it is partially multilayered by means of the circuit substrate 10, and the semiconductor device 30 is mounted on the insulating layer 3 where the circuit substrate 10 is not arranged.

The semiconductor module according to the third example of the first embodiment described above provides the following effects.

(11) Since the conductive parts 5c1 are formed on the insulating layer 3, it is possible to make maximum use of the thickness of the insulating layer 3. The insulating layer 3 can be formed with a thickness sufficient for the conductive parts 5c1 to withstand the high voltages being applied.

(12) Since the semiconductor device 30, being a heat generating device, is mounted on a non-multilayered area of the mounting board 20, it is possible to reduce the distance between the substrate 1 and the semiconductor device 30. This can improve the heat radiation capability of the semiconductor device 30.

(13) Since the conductive parts 8a1, 8b1, and 9a1 of the low-voltage circuit substrate 10 do not require high dielectric strength, the insulating layer can be reduced in thickness. The circuit substrate 10 for which higher integration is required can thus be reduced in profile.

Fourth Example

Figure 5:
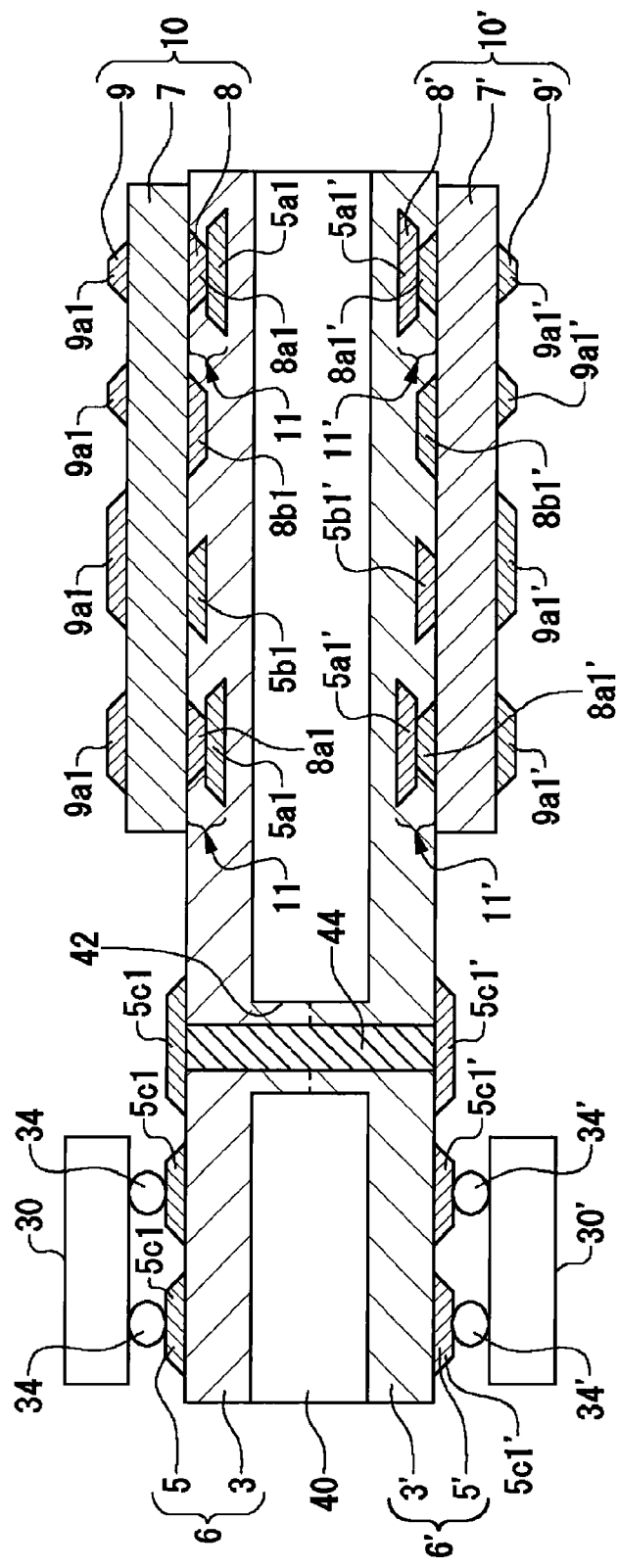
FIG. 5 is a schematic cross-sectional view showing the configuration of a semiconductor module according to a fourth example of the first embodiment of the present invention.

FIG. 5 is a schematic cross-sectional view showing the configuration of a semiconductor module according to a fourth example of the first embodiment of the present invention. The semiconductor module of this example includes a mounting board which has a first wiring structure formed on one of the surfaces of a core substrate 40 and a second wiring structure formed on the other surface of the core substrate 40. Specifically, a circuit substrate 6 is formed of copper on one surface of the core substrate 40 to a thickness of 100 to 200 µm. That is, an insulating layer 3 is formed on one surface of the core substrate 40, and conductive parts 5c1 are formed on the insulating layer 3. The conductive parts 5c1 are subjected to the same high voltage as detailed in the third example. A circuit substrate 10 is also laminated on part of the insulating layer 3. Conductive parts 8a1, 8b1, and 9a1 of the circuit substrate 10 are fed with low-voltage logic level signals (for example, 5V). A semiconductor device 30 is mounted on the area where the conductive parts 5c1 are formed. In this example, the semiconductor device 30 is connected to the conductive parts 5c1 in a flip-chip fashion using solder bumps 34. It should be appreciated that the semiconductor device 30 may be wire-bonded as detailed in the third example of the first embodiment.

In addition to this, a circuit substrate 6' is formed on the other surface of the core substrate 40. More specifically, an insulating layer 3' is formed on the other surface of the core substrate 40, and conductive parts 5c1' are formed on the insulating layer 3'. The conductive parts 5c1' are subjected to the same high voltage as that of the third example. Moreover, a circuit substrate 10' including a base 7' and conductive layers 8' and 9' is laminated in part beneath the insulating layer 3'. Conductive parts 8a1', 8b1', and 9a1' of the circuit substrate 10' are fed with low-voltage logic level signals (for example, 5V). A semiconductor device 30' is mounted on the area where the conductive parts 5c1' are formed. The semiconductor device 30' is a power device intended for an inverter module, and is connected to the conductive parts 5c1' in a flip-chip fashion using solder bumps 34'.

The semiconductor module according to the fourth example of the first embodiment described above provides the following effect.

(14) Since the semiconductor devices 30 and 30', being heat generating devices, are mounted on the non-multilayered areas of the mounting board which includes the mounting board 40, it is possible to reduce the distances between the substrate 40 and the semiconductor devices 30 and 30'. This can improve the heat radiation capabilities of the semiconductor devices 30 and 30'.

Fifth Example

Figure 6:
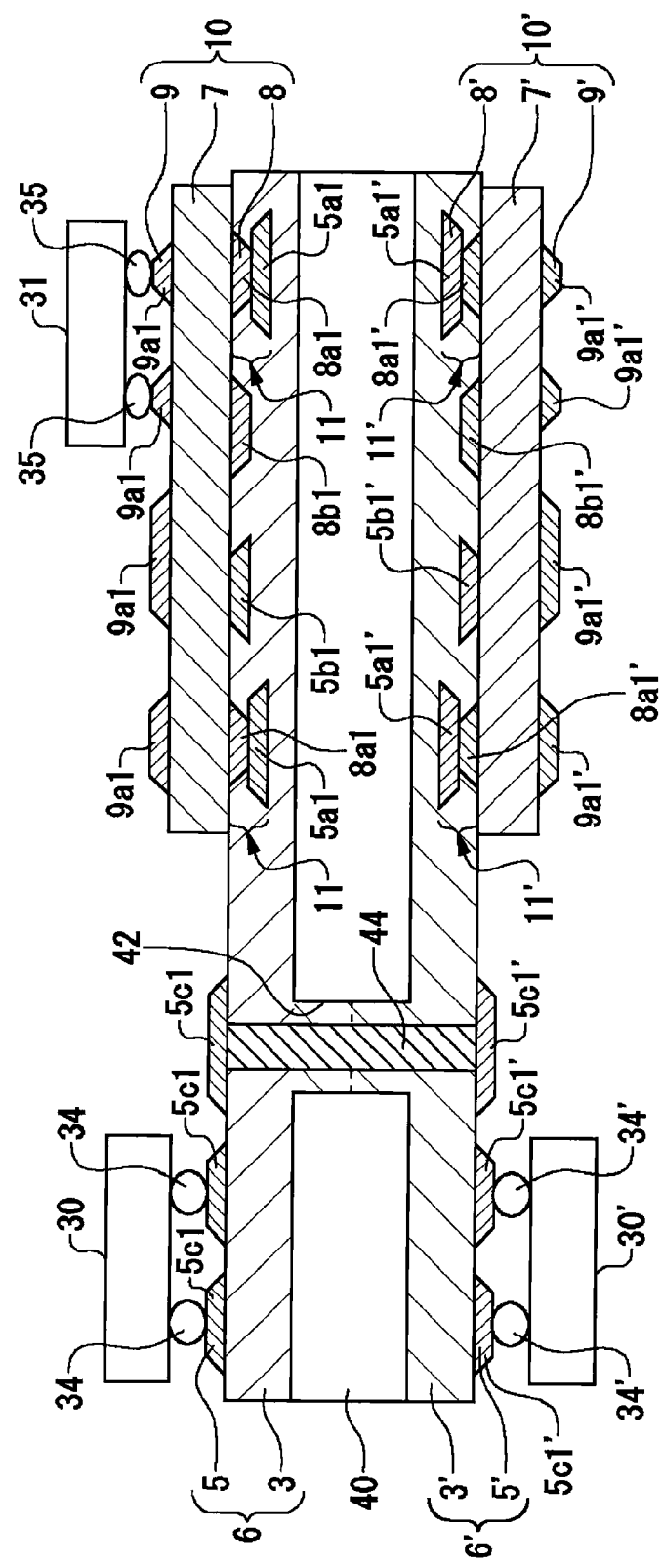
FIG. 6 is a schematic cross-sectional view showing the configuration of a semiconductor module according to a fifth example of the first embodiment of the present invention.
Figure 7:
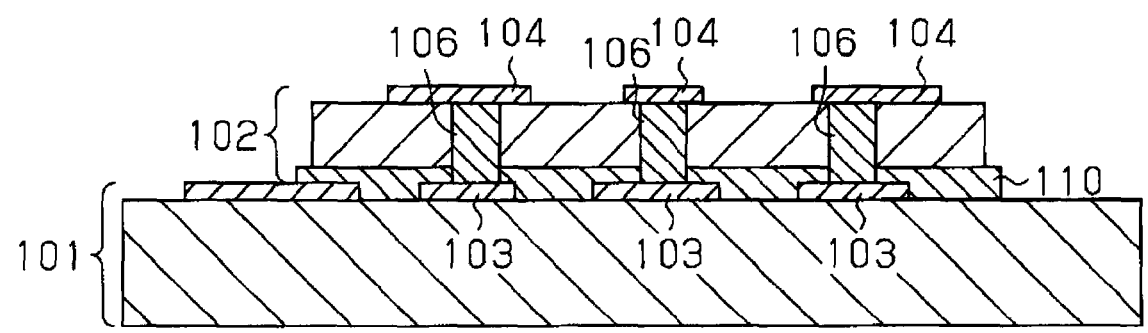
FIG. 7 is a schematic cross-sectional view of a conventional device mounting board.

FIG. 6 is a schematic cross-sectional view showing the configuration of a semiconductor module according to a fifth example of the first embodiment of the present invention. The mounting board to be used for the semiconductor module of this example has the same configuration as that of the semiconductor module according to the fourth example, except for the material of the core substrate 40. In this example, an insulating layer is used as the core substrate 40. The insulating layer is made of a thermosetting resin such as a polyimide resin, an epoxy resin, a phenol resin, or a BT resin. The insulating layer may also be a film of woven glass fibers impregnated with any of the foregoing resins. A filler having a diameter in the range of approximately 2 µm to 10 µm may be added to the insulating layer. Among preferred examples of the filler are alumina ($Al_2O_3$), silica ($SiO_2$), aluminum nitride (AlN), silicon nitride (SiN), and boron nitride (BN). The loading ratio of the filler is preferably in the range of 30% to 80% or so by weight.

In this example, a low heat-generating semiconductor device 31 for controlling the operation of the semiconductor device 30 is also mounted on the base 7. The semiconductor device 31 and conductive parts 9a1 are electrically connected through solder bumps 35.

The semiconductor module according to the fifth example of the first embodiment described above provides the following effects.

(15) Since the core substrate 40 and the insulating layers 3 and 3' have similar coefficients of thermal expansion, the core substrate 40 and the insulating layers 3 and 3' have improved adhesion.

(16) Since the low heat-generating semiconductor device 31 is arranged on the base 7, it is possible to achieve further integration of semiconductor modules without impairing the heat radiation capability.

The foregoing examples have dealt with mounting boards where the circuit substrate 10 is bonded and mounted onto the circuit substrate 6 by pressure so that their conductive parts 5a (including conductive parts 5a1) and conductive parts 8a (including conductive parts 8a1) are connected to each other, respectively. However, the present invention is not limited thereto. For example, a circuit device having electrodes (including external electrodes) formed on the surface of a semiconductor substrate, such as a WLCSP (Wafer Level Chip Size Package), may be bonded and mounted by pressure instead of the circuit substrate 10 so that these electrodes and the foregoing conductive parts 5a (including conductive parts 5a1) are connected to each other. Even in this case, the foregoing effects are also available.

The foregoing examples have dealt with the cases where one circuit substrate 10 is bonded and mounted onto the circuit substrate 6 by pressure. However, the present invention is not limited thereto. For example, a plurality of circuit substrates may be individually or simultaneously bonded and mounted by pressure. Even in this case, the foregoing effects are also available.

The foregoing examples have dealt with the cases where the conductive layer 8 of the circuit substrate 10 is embedded into the insulating layer 3. However, the present invention is not limited thereto. For example, part or all of the base 7 may be embedded into the insulating substrate 3. In this case, the sides (periphery) of the base 7 are covered by the insulating layer 3. Even if the mounting board is subjected to heat, the insulating layer 3 therefore secures the circuit substrate 10 (the base 7) from four sides. This makes the circuit substrates 6 and 10 less prone to exfoliation at the interface, providing a further improvement in joint reliability therebetween.

The foregoing examples have dealt with the mounting boards where the conductive parts are embedded into the circuit substrate 6 (including the insulating layer 3 of the circuit substrate 6) when the circuit substrate 10 is bonded and mounted onto the circuit substrate 6 by pressure. However, the present invention is not limited thereto. For example, the structure of the circuit substrate 10 may be adjusted so that the conductive parts are embedded into the circuit substrate 10.

The second example of the foregoing first embodiment has dealt with the case where the conductive parts 8a1 of the circuit substrate 10 are shaped into a trapezoidal configuration. However, the present invention is not limited thereto. For example, the conductive parts 8a1 of the circuit substrate 10 may be rectangular as detailed in the first example. Even in this case, the foregoing effect (10) can be obtained if the sizes of the conductive parts 8a1 of the connecting areas 11 (the sizes at the connecting surfaces in particular) are smaller than those of the conductive parts 5a1 (the sizes at the connecting surfaces in particular).

In the fourth and fifth examples of the foregoing first embodiment, the circuit substrate 6 and the circuit substrate 10 are formed on one surface of the core substrate 40 and the circuit substrate 6' and the circuit substrate 10' are formed on the other surface of the core substrate 40. It is only essential, however, that the circuit substrate 6 and the circuit substrate 10 be formed on one surface of the core substrate. The other surface of the core substrate 40 may be provided with known wiring structures.

In the foregoing examples, more than one circuit substrate 10 or 10' may be stacked.

This stacking can therefore realize multilayered conductive layers in the form of a plurality of circuit substrates 10 or 10'.

Problems to be Solved by the Second Embodiment

Figure 10:
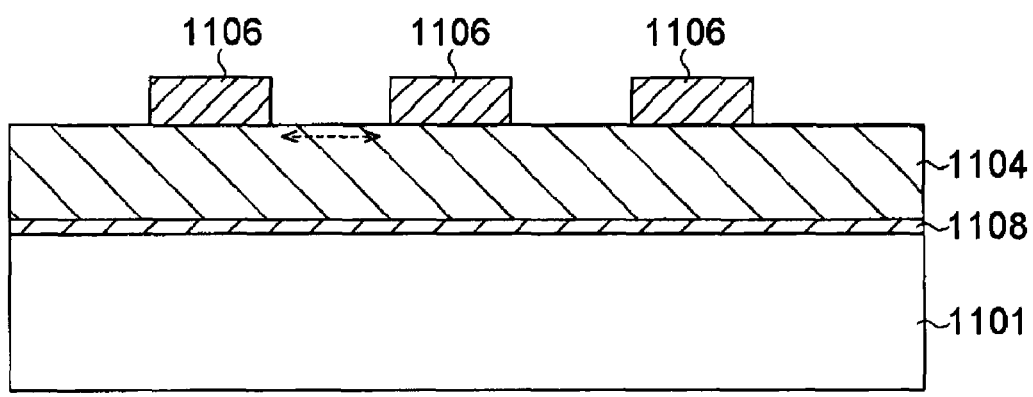
FIG. 10 is a schematic cross-sectional view of a conventional device mounting board.

FIG. 10 is a cross-sectional view schematically showing the structure of a conventional device mounting board. The conventional device mounting board (printed circuit substrate) comprises: a substrate (base) 1101 where at least the outer surface of which is made of metal; an adhesion layer (surface-treated metal material) 1108 formed on top of this substrate 1101; an insulating layer (resin layer) 1104 formed on this adhesion layer 1108; and a wiring layer (metal foil) 1106 partially etched to form a circuit pattern on this insulating layer 1104. In order to achieve a device mounting board of higher density, an effective approach is to process this circuit-patterned wiring layer 1106 in finer dimensions.

When the wiring layer 1106 is processed in finer dimensions, however, the gaps (spacings) between adjoining traces are also reduced accordingly, with the problem that it is difficult to secure a sufficient dielectric strength between the adjoining traces when a high voltage is applied. The reason for this is that the insulating layer lying between adjoining traces produces damaged layers (or unattached ends of the insulating layer) and the like on the surface by etching, and a dielectric breakdown can easily occur via those surface portions when a high voltage is applied thereto. If these portions have defective dielectric strength, the reliability of the device mounting board drops significantly. There has thus been a certain limit with regard to making the conventional circuit substrate finer, i.e., processing the wiring layer in finer dimensions.

The present embodiment has been developed in view of the foregoing circumstances, and it is a general purpose thereof to provide a technology for manufacturing a mounting board capable of processing traces in fine dimensions while reducing defects in the dielectric strength between adjoining traces.

Second Embodiment

Figure 8:
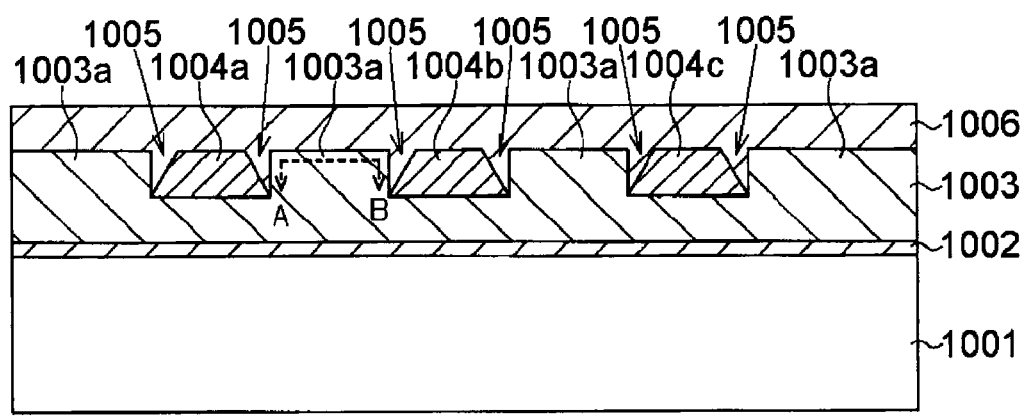
FIG. 8 is a schematic cross-sectional view of a mounting board adapted to mount a device according to a second embodiment of the present invention.

FIG. 8 is a schematic cross-sectional view showing the configuration of a mounting board adapted to mount a device according to the second embodiment. Referring to FIG. 8, the circuit substrate of the second embodiment will now be described. The circuit substrate of the present embodiment comprises: a substrate 1001; a protective layer 1002 formed on this substrate 1001; an insulating layer 1003 formed on this protective layer 1002; a plurality of conductive parts 1004a to 1004c having a forward-tapered shape, embedded in this insulating layer 1003; and an insulating layer 1006 formed to cover the insulating layer 1003 and the conductive parts 1004a to 1004c. In this instance, the insulating layer 1003 has a projection 1003a between the conductive part 1004a and the adjoining conductive part 1004b. The projection 1003a refers to a portion of the insulating layer lying above the bottoms of the recesses in the insulating layer 1003 (the bottom areas of the conductive parts 1004a to 1004c). The forward-tapered shape refers to a state where the width dimension gradually decreases from the bottom surface to the top surface, as with a trapezoid. In this case, it refers to the state that the conductive parts 1004a to 1004c decrease in width dimension from the bottom surface to the top surface. This projection 1003a of the insulating layer 1003 and a side of the conductive part 1004a (a side of the conductive part 1004b) have a gap (space) therebetween. The insulating layer 1006 intervenes in that portion to form an area 1005 where the side of the conductive part 1004a (the side of the conductive part 1004b) and the insulating layer 1003 are not in contact with each other. It should be appreciated that the substrate 1001 is an example of the "substrate" of the present invention, the insulating layer 1003 is an example of the "insulating layer" of the present invention, the conductive part 1004a is an example of the "first conductive part" of the present invention, and the conductive part 1004b is an example of the "second conductive part" of the present invention.

Specifically, in the mounting board according to the present embodiment, the substrate 1001 is made of a metal plate of copper (Cu), for example.

It should be appreciated that the substrate 1001 may be a resin substrate made of an epoxy insulating material, or a circuit substrate formed by laminating wiring layers and resin layers alternately.

The protective layer 1002 is made of an insulating resin composed mainly of an epoxy resin, for example, and is formed on the substrate 1001 to a thickness of approximately 10 μm. This protective layer 1002 functions as a protective film for securing a withstand voltage between each of the conductive parts (including conductive parts 1004a to 1004c) and the substrate 1001 when a high voltage is applied to the conductive parts. It should be noted that when the substrate 1001 is a resin substrate or circuit substrate, a humidity-proof protective film having the function of protecting the substrate 1001 from moisture and the like is used as the protective layer 1002.

The insulating layer 1003 is made of a thermosetting resin composed mainly of an epoxy resin, for example, and is formed on the protective layer 1002 to a thickness of approximately 100 µm. Here, the insulating layer 1003 has recesses that are formed in positions corresponding to the conductive parts 1004a to 1004c, and the conductive parts 1004a to 1004c are arranged in the respective recesses. More specifically, the insulating layer 1003 is configured such that the projection 1003a having a height generally flush with the top of the conductive parts 1004a and 1004b (approximately 30 µm) is interposed between the conductive part 1004a and the adjoining conductive part 1004b. Note that the same structure is also formed between the conductive part 1004b and the adjoining conductive part 1004c. In view of improved heat radiation capability of the mounting board, the insulating layer 1003 desirably has high heat conductivity. For this reason, the insulating layer 1003 preferably contains highly heat-conductive fillers such as silver, bismuth, copper, aluminum, magnesium, tin, zinc, and alloys thereof, as well as silica, alumina, silicon nitride, and aluminum nitride.

The conductive parts 1004a to 1004c are made of a metal such as copper and aluminum, and have a thickness of, for example, approximately 30 µm. The conductive parts 1004a to 1004c have a trapezoidal cross section. The sides of the conductive parts 1004a to 1004c are forward tapered. The conductive parts 1004a to 1004c form part of a wiring pattern of line/space (L/S) configuration, and are embedded in the insulating layer 1003 so that their tops are generally flush with the top of the insulating layer 1003 (the tops of the projections 1003a). Moreover, the sides of the conductive part 1004a (the sides of the conductive part 1004b) and the projections 1003a of the insulating layer 1003 form areas 1005 therebetween, where the sides of the conductive part 1004a (the sides of the conductive part 1004b) and the insulating layer 1003 are not in contact with each other. Preferred angles of the forward tapering are around 45°, for example, in view of achieving both the fine processing of the conductive parts 1004a and 1004b and the formability of the area 1005.

The conductive part 1004a and the conductive part 1004b are formed adjacent to each other. The present embodiment is predicated on a situation where the gap (spacing) between the conductive part 1004a and the conductive part 1004b in particular is reduced as much as the manufacturing limit thereof (the minimum allowable space at manufacturing time).

The insulating layer 1006 is a photosolder resist film which is made of an insulating resin composed mainly of an epoxy resin, for example. The insulating layer 1006 is formed to a thickness of approximately 50 µm so as to cover the insulating layer 1003 and the conductive parts 1004a to 1004c. In this instance, the insulating layer 1006 is formed to fill the areas 1005 where the sides of the conductive part 1004a (the sides of the conductive part 1004b) are not in contact with the insulating layer 1003. The insulating layer 1006 has the function of protecting each conductive part (including conductive parts 1004a to 1004c) from exterior environment. It should be appreciated that fillers may be added to the insulating layer 1006 in order to enhance heat conductivity.

(Manufacturing Method)

FIGS. 9A to 9D are schematic cross-sectional views for explaining the process of manufacturing the mounting board according to the second embodiment shown in FIG. 8.

Figure 9A:
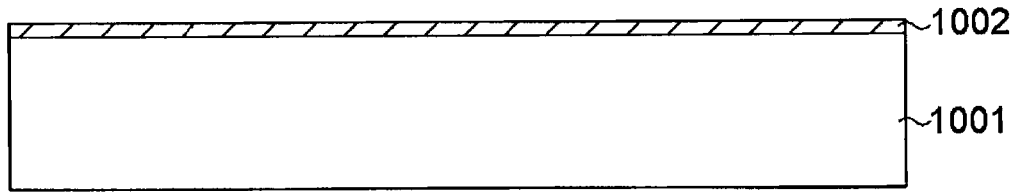
FIGS. 9A to 9D are schematic cross-sectional views for explaining the process of manufacturing the mounting board according to the second embodiment shown in FIG. 8.

Initially, as shown in FIG. 9A, a metal plate made of, for example, copper (Cu) is prepared as a substrate 1001. Then, a protective layer 1002 made of an insulating resin composed mainly of an epoxy resin is formed on this substrate 1001 by roll coating. In this instance, the protective layer 1002 shall have a thickness of approximately 10 µm, for example. This protective layer 1002 functions as a protective film for securing a withstand voltage between each of the conductive parts (including conductive parts 1004a to 1004c) and the substrate 1001 when a high voltage is applied to the conductive parts. It should be noted that when the substrate 1001 is a resin substrate or circuit substrate, a humidity-proof protective film having the function of protecting the substrate 1001 from moisture and the like is used as the protective layer 1002.

Figure 9B:
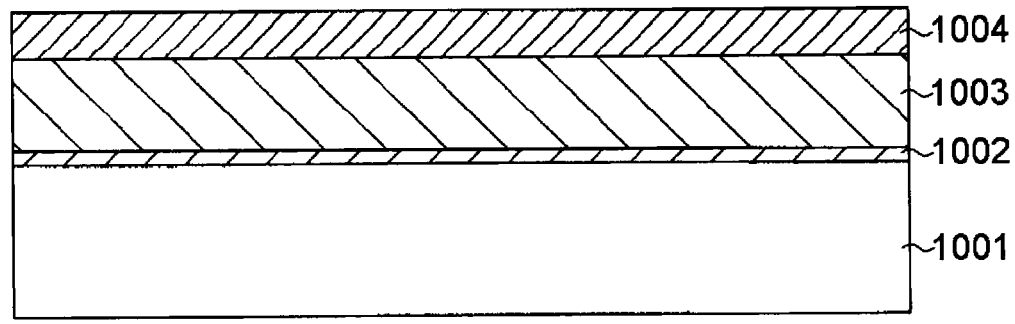

As shown in FIG. 9B, a laminate film made of an insulating layer 1003 and copper foil (not shown) is bonded onto the protective layer 1002 by thermocompression in a vacuum or reduced pressure. This forms an insulating layer 1003 made of a thermosetting resin composed mainly of an epoxy resin, having a thickness of approximately 100 µm, and copper foil (not shown) having a thickness of approximately 3 µm. Subsequently, the surface of the copper foil is plated with copper using electroless plating or electrolytic plating. As a result, a wiring layer 1004 having a thickness of approximately 30 µm is formed on the insulating layer 1003. At this step, the insulating layer 1003 made of a thermosetting resin is not fully cured by heat, but is kept in a semi-cured state (flowable state).

Figure 9C:
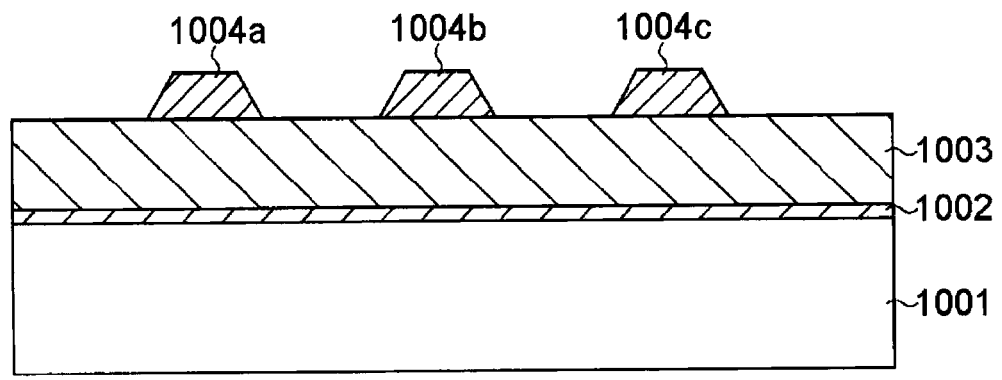

As shown in FIG. 9C, the wiring layer 1004 is patterned by using photolithographic and etching techniques. This forms conductive parts 1004a to 1004c for making part of a wiring pattern on the insulating layer 1003. In this instance, the etching condition is adjusted to shape the conductive parts 1004a to 1004c into trapezoidal cross sections (such configuration that the sides of the conductive parts 1004a to 1004c are forward tapered at an angle of approximately 45°).

Figure 9D:
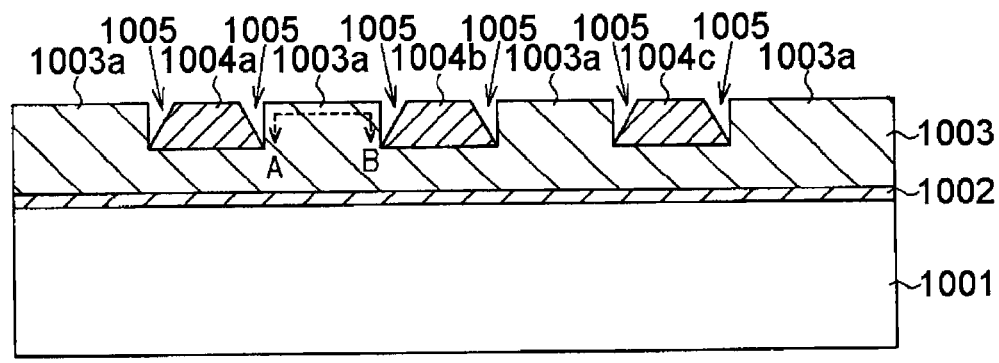

As shown in FIG. 9D, the substrate 1001 having the conductive parts 1004a to 1004c formed thereon is sandwiched between flat plates (not shown) from above and below, and a uniform pressure (approximately 10 MPa) is applied to the conductive parts 1004a to 1004c. This pushes the conductive parts 1004a to 1004c into the insulating layer 1003 (press-in step). Since the insulating layer 1003 is in a semi-cured state (flowable state), the conductive parts 1004a to 1004c are easily embedded into the insulating layer 1003. This forms recesses in the insulating layer 1003 at positions corresponding to the conductive parts 1004a to 1004c, as well as forms the projection 1003a integrally on the insulating layer 1003 between the conductive part 1004a and the adjoining conductive part 1004b. In this instance, the conductive parts 1004a and 1004b are embedded so that their tops are generally flush with the top of the insulating layer 1003 (the top of the projection 1003a). At the same time, the sides of the conductive part 1004a (the sides of the conductive part 1004b) and the projections 1003a of the insulating layer 1003 create gaps (spaces) therebetween. This forms areas 1005 where the sides of the conductive part 1004a (the sides of the conductive part 1004b) and the insulating layer 1003 are not in contact with each other. Subsequently, heat treatment (150° C., 30 minutes) is applied to the insulating layer 1003 so that the insulating layer 1003 is cured completely (curing step).

As shown in FIG. 8, a photosolder resist film made of an insulating resin composed mainly of an epoxy resin, for example, is finally formed as the insulating layer 1006 to a thickness of approximately 50 µm so as to cover the insulating layer 1003 and the conductive parts 1004a to 1004c. In this instance, the insulating layer 1006 is formed to fill the areas 1005 where the sides of the conductive part 1004a (the sides of the conductive part 1004b) are not in contact with the insulating layer 1003. The insulating layer 1006 has the function of protecting each conductive part (including conductive parts 1004a to 1004c) from exterior environment. It should be appreciated that fillers may be added to the insulating layer 1006 in order to enhance heat conductivity.

Through these steps, the mounting board according to the present embodiment is manufactured.

The mounting board and the method for manufacturing the same according to the present embodiment described above provide the following effects.

(1) The mounting board in which the sides of each conductive part (including conductive parts 1004a and 1004b) and the insulating layer 1003 (including projections 1003a) have gaps therebetween (including areas 1005 where the insulating layer 1003 is not in contact with the sides of the conductive parts 1004a and 1004b) is formed by pressing the conductive parts 1004a to 1004c having forward-tapered sides into the insulating layer 1003. This simplifies the steps for manufacturing such a device mounting board. It is also possible to reduce the manufacturing cost.

(2) The conductive parts 1004a and 1004b are shaped to have a trapezoidal cross section with forward-tapered sides. A mounting board such that the contact areas between the sides of the conductive parts 1004a to 1004c and the insulating layer 1003 come to the bottom areas of the trapezoids can thus be manufactured easily. This maximizes the length of a path leading from an end A of the conductive part 1004a to an end B of the conductive part 1004b along the surface of the insulating layer 1003 (being the projection 1003a of the insulating layer 1003). As a result, a mounting board less prone to dielectric breakdown can be provided at low cost.

(3) The conductive parts 1004a and 1004b with forward-tapered side tops are pressed into the insulating layer 1003 to form respective recesses in the insulating layer 1003, and the conductive parts 1004a and 1004b are arranged in these recesses. This makes it possible to interpose the insulating layer 1003 between the conductive part 1004a and the adjoining conductive part 1004b, thereby creating gaps between the sides of each conductive part (including the conductive parts 1004a and 1004b) and the insulating layer 1003 (the gap being the areas 1005 where the insulating layer 1003 is not in contact with the sides of the conductive part 1004a or 1004b). Consequently, the length of the path between the conductive part 1004a and the conductive part 1004b along the surface of the insulating layer 1003 (effective gap) is increased as compared to heretofore. A mounting board of improved reliability, less prone to dielectric breakdown through the surface of the insulating layer 1003, is thus provided.

(4) Since the conductive parts 1004a to 1004c are shaped into trapezoidal cross sections with forward-tapered sides, the contact areas between the sides of the conductive part 1004a (the sides of the conductive part 1004b) and the insulating layer 1003 are limited to the bottom area of the trapezoid. This maximizes the length of the path leading from the end A of the conductive part 1004a to the end B of the conductive part 1004b along the surface of the insulating layer 1003 (the projection 1003a of the insulating layer 1003). Consequently, the mounting board further improves in reliability since dielectric breakdown between the conductive part 1004a and the adjoining conductive part 1004b through the surface of the insulating layer 1003 (the interface between the insulating layers 1003 and 1006) is less prone to occur. It should be appreciated that if the areas 1005 for precluding contact with the insulating layer 1003 are formed only in upper part (top part) of the sides of the conductive part 1004a (the sides of the conductive part 1004b), then that part alone contributes to an increase in path length. The effect of suppressing dielectric breakdown can thus be provided accordingly.

(5) Even if the gap (spacing) between the conductive part 1004a and the adjoining conductive part 1004b is the same as that of the conventional ones in dimension, the present configuration can increase the effective gap of that area against dielectric breakdown and thus prevent the mounting board from deteriorating in reliability. This makes it possible to make the gap (spacing) between the conductive part 1004a and the adjoining conductive part 1004b even narrower, thereby allowing further miniaturization of the mounting board.

(6) Since the trapezoidal-shaped conductive parts 1004a and 1004b (being the conductive parts 1004a and 1004b with forward-tapered sides) are pushed into the insulating layer 1003 by pressure, they can be embedded in the insulating layer 1003 in a self-aligning fashion. The areas 1005 for precluding contact with the insulating layer 1003 can thus be formed beside the conductive part 1004a (beside the conductive part 1004b) easily. This allows cost saving of the mounting board.

The foregoing embodiment has dealt with the mounting board and the method for manufacturing the same where the insulating layer 1006 is formed to cover the insulating layer 1003 and each conductive part (including conductive parts 1004a to 1004c). However, the present invention is not limited thereto. For example, the mounting board need not have the insulating layer 1006. Even in this case, the foregoing effects are also available.

The foregoing embodiment has dealt with the case where the insulating layer 1006 is made of a photosolder resist film having the function of protecting each conductive part (including conductive parts 1004a to 1004c). However, the present invention is not limited thereto. For example, the insulating layer 1006 may be made of the same material as that of the insulating layer 1003. Additional conductive parts may also be formed thereon. In this case, it is possible to provide the foregoing effects, and to multilayer the mounting board of improved dielectric strength as well.

The foregoing embodiment has dealt with the case where the tops of the conductive parts 1004a and 1004b are generally flush with the top of the insulating layer 1003 (being the tops of the projections 1003a). However, the present invention is not limited thereto. For example, the tops of the conductive parts 1004a and 1004b may be either protruded or recessed from the top of the insulating layer 1003 (the tops of the projections 1003a) as long as the areas 1005 for precluding contact with the insulating layer 1003 are formed beside the conductive parts 1004a and 1004b. Even in this case, the effect of increasing the path length and suppressing dielectric breakdown accordingly is also available.

The foregoing embodiment has dealt with the case where the conductive part 1004a (conductive part 1004b) of forward-tapered shape has a trapezoidal cross section. However, the present invention is not limited thereto. For example, rectangular conductive parts may be chamfered at the top edges so that the upper sides alone have the forward-tapered shape. Similarly, the top edges alone may be rounded. In this case, the forward-tapered portions of the conductive part 1004a (conductive part 1004b) create the areas 1005 for precluding contact with the insulating layer 1003, and these areas contribute to increased path lengths.

What is claimed is:

1. A semiconductor module, comprising:
   a device mounting board comprising:
   a first circuit substrate having a first conductive part embedded in an insulating layer;
   a second circuit substrate arranged on the insulating layer, the second circuit substrate having a second conductive part, wherein the second conductive part is electrically connected with the first conductive part and the second conductive part is embedded in the insulating layer; and a third conductive part for a voltage higher than that applied to the second conductive part to be applied thereto, the third conductive part being formed on the insulating layer of the first circuit substrate; and a semiconductor device mounted on an area of the device mounting board where the third conductive part is formed.

2. The semiconductor module according to claim 1, wherein the first conductive part and the second conductive part are made of the same metal.

3. The semiconductor module according to claim 1 or 2, further comprising a metal substrate on which the first circuit substrate is mounted.

4. A mounting board, comprising:
a core substrate;
a first wiring structure formed on one of principle surfaces of the core substrate; and
a second wiring structure formed on the other principle surface of the core substrate,
wherein at least either one of the first wiring structure and the second wiring structure includes:
a first circuit substrate having a first conductive part embedded in an insulating layer; and
a second circuit substrate arranged on the insulating layer, the second circuit substrate having a second conductive part, and
wherein the second conductive part is electrically connected with the first conductive part while the second conductive part is embedded in the insulating layer.

5. The mounting board according to claim 4, wherein the first conductive part and the second conductive part are made of the same metal.

6. The mounting board according to claim 4, wherein the core substrate is made of metal.

7. The mounting board according to claim 4, wherein the core substrate is made of an insulating layer.

8. A semiconductor module, comprising:
the mounting board according to any one of claims 4 to 7; and
semiconductor devices mounted on the first wiring structure and the second wiring structure of the mounting board.

9. The semiconductor module according to claim 8, further comprising a third conductive part for a voltage higher than applied to the second conductive part to be applied to, the third conductive part being formed on the insulating layer of the first circuit substrate, and wherein
the semiconductor devices are mounted on an area where the third conductive part is formed.

* * * * *